United States Patent
Ye

(10) Patent No.: US 11,494,017 B2
(45) Date of Patent: Nov. 8, 2022

(54) TOUCH DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/251,796

(22) PCT Filed: Jul. 29, 2020

(86) PCT No.: PCT/CN2020/105486
§ 371 (c)(1),
(2) Date: Dec. 13, 2020

(87) PCT Pub. No.: WO2022/011749
PCT Pub. Date: Jan. 20, 2022

(65) Prior Publication Data
US 2022/0019305 A1    Jan. 20, 2022

(30) Foreign Application Priority Data
Jul. 14, 2020    (CN) .......................... 202010676426.4

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0445* (2019.05); *H01L 27/323* (2013.01);
(Continued)

(58) Field of Classification Search
CPC .......... H01L 27/323; G06F 3/041–042; G06F 3/0445; G06F 2203/04113
See application file for complete search history.

(56) References Cited

U.S. PATENT DOCUMENTS

2013/0278513 A1* 10/2013 Jang ...................... G06F 3/0445
345/173
2017/0024075 A1* 1/2017 Chiang ................. G06F 3/0445
(Continued)

*Primary Examiner* — Sanjiv D. Patel
(74) *Attorney, Agent, or Firm* — PV IP PC; Wei Te Chung; Ude Lu

(57) ABSTRACT

The present disclosure provides a touch display device including an organic light emitting diode (OLED) display panel and a touch layer. The OLED display panel includes a common cathode and a plurality of redundant cathodes. The common cathode and the plurality of redundant cathodes are located in a same conductive layer. The touch layer is disposed on a side of the OLED display panel. The touch layer includes a plurality of touch electrodes. Orthographic projections of the touch electrodes on the touch display device partially overlap orthographic projections of the plurality of redundant cathodes on the touch display device.

16 Claims, 4 Drawing Sheets

(51) Int. Cl.
*G06F 3/044* (2006.01)
*H01L 51/52* (2006.01)

(52) U.S. Cl.
CPC ...... *H01L 27/3218* (2013.01); *H01L 27/3246* (2013.01); *H01L 51/5237* (2013.01); *G06F 2203/04112* (2013.01)

(56) References Cited

U.S. PATENT DOCUMENTS

2018/0364847 A1* 12/2018 Xiong .................. G06F 3/0445
2019/0187848 A1* 6/2019 Ma ...................... G06F 3/0446
2019/0280051 A1* 9/2019 Cheng .................. G06F 3/0443

* cited by examiner

TOUCH DISPLAY DEVICE

RELATED APPLICATIONS

This application is a Notional Phase of PCT Patent Application No. PCT/CN2020/105486 having international filing date of Jul. 29, 2020, which claims the benefit of priority of Chinese Patent Application No. 202010676426.4 filed on Jul. 14, 2020. The contents of the above applications are all incorporated by reference as if fully set forth herein in their entirety.

FIELD OF INVENTION

The present disclosure relates to the field of display technologies, and particularly relates to a touch display device.

BACKGROUND OF INVENTION

Flexible organic light emitting diode (OLED) display devices have advantages of active light emission, wide viewing angles, wide color gamut, high brightness, fast response speeds, low power consumption, and structural flexibility. These advantages make the flexible OLED display devices more and more popular in the market, and the flexible OLED display devices gradually replace liquid crystal displays (LCDs) and have become a mainstream of display technology.

The flexible OLED display devices are divided into top-emitting type and bottom-emitting type according to their light-emitting positions. Currently, the top-emitting type is a mainstream of mass production technology of the flexible OLED display devices. As shown in FIG. 1, it is a schematic view of a conventional top-emitting typed OLED touch display device. The conventional top-emitting typed OLED display device includes a thin film transistor (TFT) array layer 100, an anode layer 101, a pixel definition layer (PDL) 102, a photo spacer (PS) 103, an electroluminescent (EL) layer 104, a cathode layer 105, a thin film encapsulation (TFE) layer 106, and a touch layer 107. The touch layer 107 includes touch electrodes 1071 composed of a plurality of metal meshes. Each of the touch electrodes 1071 is disposed between two adjacent subpixels. Because a manufacturing process of the cathode layer 105 of the OLED display device happens after a fabrication of a TFT array substrate and an evaporation of luminescent material of the EL layer, and the cathode layer 105 is vapor-deposited on entire and upper surfaces of the pixel definition layer of the TFT substrate and the EL layer, there is only the TFE layer 106 located between the touch electrodes 1071 positioned on a surface of the TFE layer 106 and the cathode layer 105 of the OLED. A thickness of the TFE layer 106 is generally less than or equal to 10 um, which results in a large parasitic capacitance generated between the touch electrodes 1071 and the cathode layer 105. The greater the parasitic capacitance between the touch electrodes 1071 and the cathode layer 105, the greater a noise interference generated during a below display is coupled to the touch electrodes 1071, and the greater a charging time required for a touch node capacitance, thereby reducing a touch report rate.

Therefore, it is necessary to propose a technical solution to reduce the parasitic capacitance between the cathode and the touch electrodes, so as to prevent the touch report rate from decreasing.

Technical Problems

The present disclosure aims to provide a touch display device to solve a problem that parasitic capacitance is generated between a plurality of touch electrodes and a common cathode.

Technical Solutions

In order to achieve the above purpose, the present disclosure provides a touch display device, the touch display device includes:

an organic light emitting diode (OLED) display panel, the OLED display panel comprising a common cathode and a plurality of redundant cathodes, and the common cathode and the plurality of redundant cathodes located in a same conductive layer and electrically insulated; and a touch layer, the touch layer disposed on a side of the OLED display panel, and the touch layer comprising a plurality of touch electrodes; and wherein orthographic projections of the plurality of touch electrodes on the touch display device partially overlap orthographic projections of the plurality of redundant cathodes on the touch display device; and the OLED display panel further comprises an encapsulation layer, and the encapsulation layer is located between the common cathode and the touch layer.

In the above touch display device, the OLED display panel comprises a plurality of subpixels and an insulating layer, the insulating layer comprises a plurality of openings, the plurality of subpixels are disposed in the plurality of openings, the plurality of subpixels share the common cathode, each of the redundant cathodes is positioned between adjacent two of the subpixels, the OLED display panel further comprises partition portions disposed on portions of the insulating layer, each of the portions is positioned between adjacent two of the subpixels, and the partition portions are configured to separate the common cathode from the plurality of redundant cathodes.

In the above touch display device, the touch electrodes comprise a plurality of metal meshes, each of the metal meshes surrounds one of the subpixels, an orthographic projection of each of the metal meshes on the touch display device partially overlaps the orthographic projections of the plurality of redundant cathodes on the touch display device.

In the above touch display device, the orthographic projections of the plurality of redundant cathodes on the touch display device are evenly arranged along orthographic projections of the plurality of metal meshes on the touch display device.

In the above touch display device, the metal meshes comprise metal lines, a dimension of each of the partition portions along a width direction of the metal lines is greater than or equal to a width of one of the metal lines.

In the above touch display device, the partition portions are grooves defined in the insulating layer, at least a part portion of each of the grooves adjacent to a bottom has a first width, at least a part portion of each of the grooves away from the bottom has a second width, the first width is greater than the second width, and the redundant cathodes are disposed in the grooves.

In the above touch display device, each of the grooves comprises a first groove and a second groove communicated with the first groove, the first groove has the first width, the second groove has the second width, and each of the redundant cathodes is disposed in the first groove.

In the above touch display device, the insulating layer comprises a pixel definition layer, the grooves are defined in the pixel definition layer.

A touch display device is provided, and the touch display device comprises:

an organic light emitting diode (OLED) display panel, the OLED display panel comprising a common cathode and a plurality of redundant cathodes, and the common cathode and the plurality of redundant cathodes located in a same conductive layer and electrically insulated; and a touch layer, the touch layer disposed on a side of the OLED display panel, and the touch layer comprising a plurality of touch electrodes; and wherein orthographic projections of the plurality of touch electrodes on the touch display device partially overlap orthographic projections of the plurality of redundant cathodes on the touch display device.

In the above touch display device, the OLED display panel comprises a plurality of subpixels and an insulating layer, the insulating layer comprises a plurality of openings, the plurality of subpixels are disposed in the plurality of openings, the plurality of subpixels share the common cathode, each of the redundant cathodes is positioned between adjacent two of the subpixels, the OLED display panel further comprises partition portions disposed on portions of the insulating layer, each of the portions is positioned between adjacent two of the subpixels, and the partition portions are configured to separate the common cathode from the plurality of redundant cathodes.

In the above touch display device, the touch electrodes comprise a plurality of metal meshes, each of the metal meshes surrounds one of the subpixels, an orthographic projection of each of the metal meshes on the touch display device partially overlaps the orthographic projections of the plurality of redundant cathodes on the touch display device.

In the above touch display device, the orthographic projections of the plurality of redundant cathodes on the touch display device are evenly arranged along orthographic projections of the plurality of metal meshes on the touch display device.

In the above touch display device, the metal meshes comprise metal lines, a dimension of each of the partition portions along a width direction of the metal lines is greater than or equal to a width of one of the metal lines.

In the above touch display device, the partition portions are grooves defined in the insulating layer, at least a part portion of each of the grooves adjacent to a bottom has a first width, at least a part portion of each of the grooves away from the bottom has a second width, the first width is greater than the second width, and the redundant cathodes are disposed in the grooves.

In the above touch display device, each of the grooves comprises a first groove and a second groove communicated with the first groove, the first groove has the first width, the second groove has the second width, and each of the redundant cathodes is disposed in the first groove.

In the above touch display device, the insulating layer comprises a pixel definition layer, the grooves are defined in the pixel definition layer.

In the above touch display device, the insulating layer comprises a pixel definition layer and a planarization layer, the second groove is defined in the pixel definition layer and penetrates through the pixel definition layer along a thickness direction of the pixel definition layer, and the first groove is defined in the planarization layer.

In the above touch display device, a longitudinal section of the first groove is an inverted trapezoid, and a longitudinal section of the second groove is an inverted trapezoid.

In the above touch display device, a percentage ratio of an area of the common cathode to a sum of the area of the common cathode and areas of the plurality of redundant cathodes is greater than or equal to 75% and is less than 100%.

In the above touch display device, the touch electrodes comprise driving electrodes and sensing electrodes, and the driving electrodes are electrically insulated from the sensing electrodes.

Beneficial Effects

The present disclosure provides a touch display device, the touch display device includes an OLED display panel and a touch layer. The OLED display panel includes a common cathode and a plurality of redundant cathodes, the common cathode and the plurality of redundant cathodes are located in a same conductive layer and are electrically insulated; the touch layer is disposed on a side of the OLED display panel, and the touch layer includes a plurality of touch electrodes; the touch layer is disposed on a side of the OLED display panel, and the touch layer includes a plurality of touch electrodes; orthographic projections of the plurality of touch electrodes on the touch display device partially overlap orthographic projections of the plurality of redundant cathodes on the touch display device, thereby reducing parasitic capacitance generated between the plurality of touch electrodes and the cathode, preventing excessive parasitic capacitance from generating too much noise interference on the touch electrodes, which will cause a longer charging time required for a touch node capacitance, so as to prevent the touch report rate from decreasing.

DETAILED DESCRIPTION OF EMBODIMENTS

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into protection scope of the present disclosure.

Figure 1:
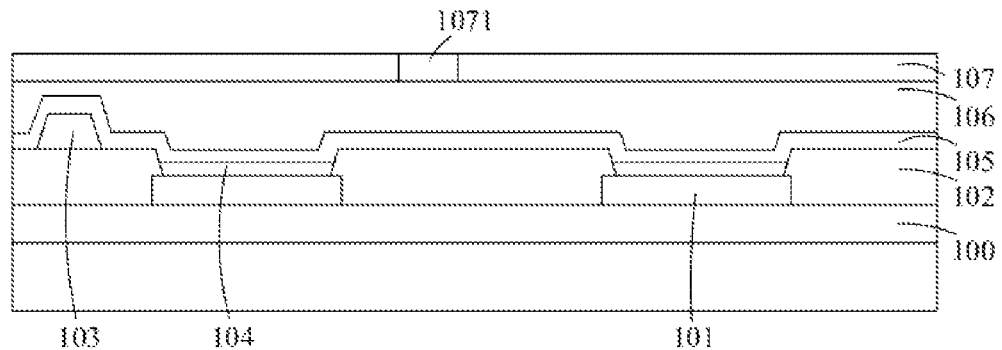
FIG. 1 is a schematic view of a conventional top-emitting typed OLED touch display device.
Figure 2:
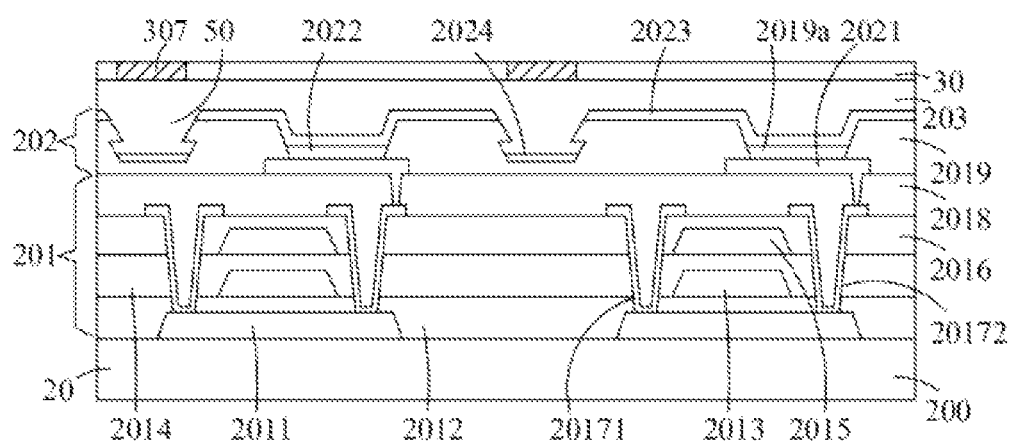
FIG. 2 is a schematic view of a touch display device in a first embodiment of the present disclosure.

Referring to FIG. 2, it is a schematic view of a touch display device in a first embodiment of the present disclosure. The touch display device 40 includes an organic light emitting diode (OLED) display panel 20 and a touch layer 30. The OLED display panel 20 may be a flexible OLED display panel or a rigid OLED display panel. The touch layer 30 is disposed on a side of the OLED display panel 20.

The OLED display panel 20 includes a base 200, a thin film transistor (TFT) array layer 201, an OLED array layer 202, and an encapsulation layer 203.

Figure 3:
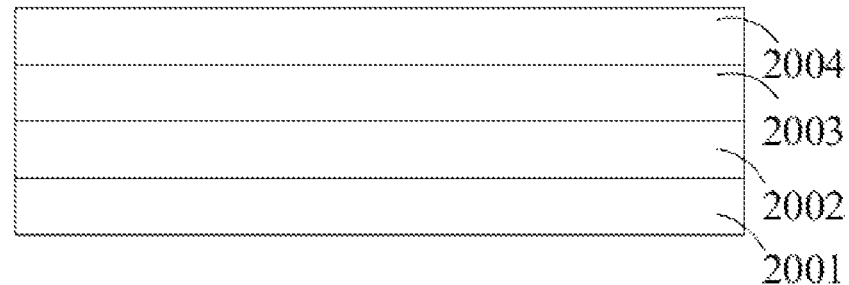
FIG. 3 is a schematic view of a base of the touch display device in FIG. 2.

The base 200 is a flexible base. As shown in FIG. 3, it is a schematic view of a base of the touch display device in FIG. 2. The base 200 includes a first organic layer 2001, a first buffer layer 2002, a second organic layer 2003, and a second buffer layer 2004, which are successively laminated. The first organic layer 2001 and the second organic layer 2003 are polyimide layers. The first buffer layer 2002 and the second buffer layer 2004 are configured to block water vapor and oxygen, etc. Manufacturing materials of the first buffer layer 2002 and the second buffer layer 2004 are all selected from at least one of silicon oxide and silicon nitride. In other embodiments, the base may also be a glass substrate.

The TFT array layer 201 includes a plurality of thin film transistors (TFTs) arranged in an array. The TFT array layer includes an active layer 2011, a gate insulating layer 2012, gate electrodes 2013, a first insulating layer 2014, patterned metal parts 2015, a second insulating layer 2016, source and drain electrodes (20171, 20172), a planarization layer 2018, and a pixel definition layer 2019.

The active layer 2011 is disposed on the base 200. A manufacturing material of the active layer 2011 is polycrystalline silicon. The gate insulating layer 2012 covers the active layer 2011 and the base 200. A manufacturing material of gate insulating layer 2012 is at least one of silicon nitride and silicon oxide. A thickness of the gate insulating layer 2012 ranges from 800 Å to 1200 Å. The gate electrode 2013 is disposed on the gate insulating layer 2012 and corresponds to the active layer 2011. A manufacturing material of the gate electrode 2013 is selected from at least one of molybdenum, aluminum, titanium, and copper. The first insulating layer 2014 covers the gate electrodes 2013 and the gate insulating layer 2012. A manufacturing material of the first insulating layer 2014 is selected from at least one of silicon nitride or silicon oxide. The patterned metal parts 2015 are disposed on the first insulating layer 2014 and correspond to the gate electrodes 201. The patterned metal parts 2015 and the gate electrodes 2013 form a capacitor. Orthographic projections of the patterned metal parts 2015 on the touch display device 40 completely overlap orthographic projections of the gate electrodes 2013 on the touch display device 40. A manufacturing material of the patterned metal parts 2015 is the same as that of the gate electrodes 2013. The second insulating layer 2016 covers the patterned metal parts 2015 and the first insulating layer 2014. The source and drain electrodes (20171, 20172) include source electrodes 20171 and drain electrodes 20172. The source electrodes 20171 and the drain electrodes 20172 are disposed on the second insulating layer 2016, the source electrodes 20171 and the drain electrodes 20172 are in contact with the active layer 2011 through vias penetrating through the first insulating layer 2014, the second insulating layer 2016, and the gate insulating layer 2012, and the source electrode 20171 and the drain electrode 20172 are symmetrically arranged on opposite sides of the gate electrode 2013, respectively. The planarization layer 2018 covers the source and drain electrodes (20171, 20172) and a second gate insulating layer 2016. The planarization layer 2018 is an organic insulating layer. A thickness of the planarization layer 2018 ranges from 0.8 um to 2.5 um. The pixel definition layer 2019 covers multiple independent anodes and the planarization layer 2018. A plurality of openings 2019a are defined in pixel definition layer 2019, and a longitudinal section of the opening 2019a is an inverted trapezoid. The pixel definition layer 2019 is an organic insulating layer. A thickness of the pixel definition layer 2019 ranges from 0.8 um to 2.5 um, for example, 2 um.

The OLED array layer 202 includes organic light emitting diodes (OLEDs) arranged in an array. The OLED array layer includes a plurality of independent anodes 2021, electroluminescent (EL) layers 2022 disposed on each of the anodes 2021 and located in the openings 2019a, and a common cathode 2023. The common cathode 2023 partially covers the EL layer 2022, and the common cathode 2023 is partially positioned on the pixel definition layer 2019.

In the embodiment, the OLED display panel 20 includes a plurality of subpixels. The plurality of subpixels include red subpixels R, blue subpixels B, and green subpixels G. Each of the OLEDs corresponds one of the subpixels. The plurality of subpixels share the common cathode 2023. Each of the subpixels includes the anode 2021 and the EL layer 2022. The EL layer 2022 is disposed between the common cathode 2023 and the anode 2021. Portions of the common cathode 2023 corresponding to the plurality of subpixels are electrically connected to each other. As mentioned earlier, the multiple EL layers 2022 are positioned in the openings 2019a of the pixel definition layer 2019, so the plurality of subpixels are disposed in the plurality of openings 2019a.

The OLED display panel further includes a plurality of redundant cathodes 2024. The common cathode 2023 and the plurality of redundant cathodes 2024 are located in a same conductive layer and are electrically insulated. The plurality of redundant cathodes 2024 and the common cathode 2023 are prepared by a same conductive layer. A manufacturing material of the conductive layer may be a transparent metal oxide, such as indium tin oxide or indium zinc oxide. The common cathode 2023 surrounds the plurality of redundant cathodes 2024. Each of the redundant cathodes 2024 is positioned between two adjacent subpixels.

The encapsulation layer 203 covers the common cathode 2023, the redundant cathodes 2024, and the pixel definition layer 2019. The encapsulation layer 203 is a thin film package layer. The thin film package layer includes two inorganic layers and an organic layer positioned between the two inorganic layers. The inorganic layer is located on a side adjacent to the common cathode 2023. A manufacturing material of the inorganic layer is selected from at least one of silicon nitride or silicon oxide. A manufacturing material of the organic layer is selected from polyimide. A thickness of the encapsulation layer 203 ranges from 8 um to 15 um, such as 10 um, 12 um, or 14 um.

Figure 4:
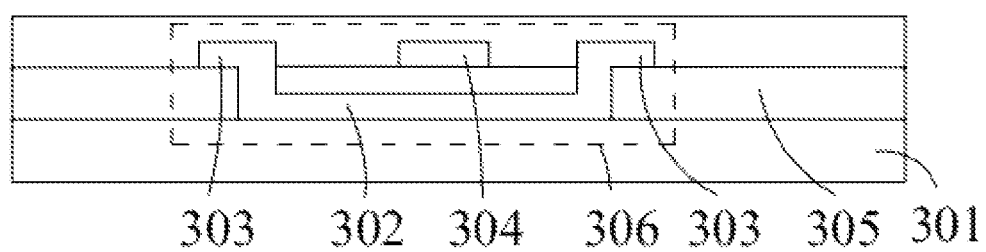
FIG. 4 is a schematic view of a touch layer of the touch display device in FIG. 2.

The touch layer 30 is located on a side of the OLED display panel 20. The touch layer 30 is located on a out-light side of the OLED display panel 20. Specifically, the encapsulation layer 203 is located between the common cathode 2023 and the touch layer 30. As shown in FIG. 4, it is a schematic view of a touch layer of the touch display device in FIG. 2. The touch layer 30 includes a third buffer layer 301, bridging lines 302, a passivation layer 305, sensing electrodes 303, and driving electrodes 304. A manufacturing material of the third buffer layer 301 is silicon nitride or silicon oxide. The bridging lines 302 are disposed on the third buffer layer 301, and the bridging lines 302 are metal wires. The passivation layer 305 covers the bridging lines 302 and the third buffer layer 301. The sensing electrodes 303 and the driving electrodes 304 are all disposed on the passivation layer 305, and two adjacent sensing electrodes 303 are electrically connected through the bridging lines 302. Each of the sensing electrodes 303 is connected to the bridging lines 302 through vias defined in the passivation layer 305. Two adjacent driving electrodes 304 are formed continuously. The driving electrodes 304 and the sensing electrodes 303 are electrically insulated. The driving electrodes 304 and the sensing electrodes 303 compose the touch electrodes 306. The touch layer 30 further covers the driving electrodes 304, the sensing electrodes 303, and a protective layer of the passivation layer 305. The protective layer is an organic layer. The touch electrodes include a plurality of metal meshes. The driving electrodes 304 and the sensing electrodes 303 are all composed of the metal meshes. The metal meshes are composed of metal lines 307.

In the embodiment, orthographic projections of the plurality of touch electrodes 306 on the touch display device partially overlap orthographic projections of the plurality of redundant cathodes 2024 on the touch display device. Because the redundant cathodes 2024 do not load electrical signals (floating), parasitic capacitance is not generated between the redundant cathodes 2024 and the touch electrodes 306, thereby reducing the parasitic capacitance generated between the plurality of touch electrodes and the cathode, preventing excessive parasitic capacitance from generating too much noise interference on the touch electrodes, which will cause a longer charging time required for a touch node capacitance, so as to prevent the touch report rate from decreasing.

In the embodiment, the touch electrodes include a plurality of metal meshes, an orthographic projection of each of the metal meshes on the touch display device partially overlaps the orthographic projections of the plurality of redundant cathodes on the touch display device, and each of the metal meshes surrounds one of the subpixels. At leash one of the redundant cathodes corresponds to part portions of one of the metal meshes.

In the embodiment, the orthographic projections of the plurality of redundant cathodes on the touch display device are evenly arranged along orthographic projections of the plurality of metal meshes on the touch display device, thereby making the plurality of redundant cathodes evenly distributed and making a resistance of the common cathode uniformly distributed in different areas.

In the embodiment, a percentage ratio of an area of the common cathode to a sum of the area of the common cathode and areas of the plurality of redundant cathodes is greater than or equal to 75% and is less than 100%, thereby reducing the parasitic capacitance between the cathode and the touch electrodes, meanwhile, ensuring the resistance of the common cathode is less than or equal to 30 ohms and ensuring that the resistance of the common cathode meets requirements. That is, a balance between smaller parasitic capacitance of the touch electrodes and smaller resistance of the common cathode is achieved. The percentage ratio may be, for example, 78%, 80%, 82%, 84%, 86%, 88%, 90%, or 95%.

Figure 6:
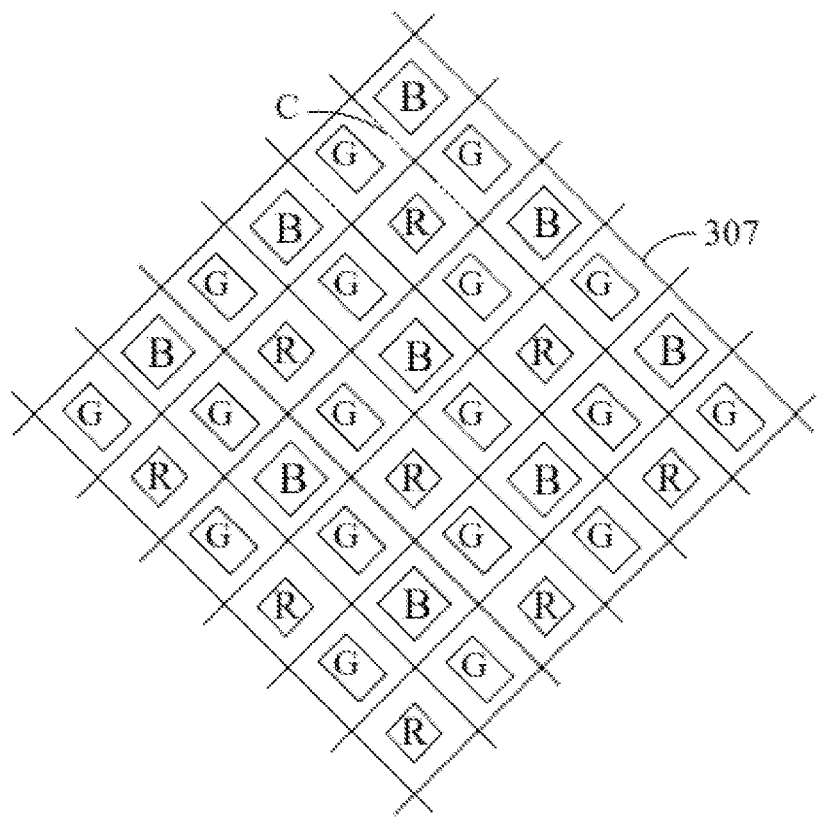
FIG. 6 is a first schematic view showing that touch electrodes surround subpixels and orthographic projections of the touch electrodes on the touch display device partially overlap orthographic projections of redundant cathodes on the touch display device.

As shown in FIG. 6, it is a first schematic view showing that the touch electrodes surround the subpixels and the orthographic projections of the touch electrodes on the touch display device partially overlap the orthographic projections of the redundant cathodes on the touch display device. The metal meshes are rhombic metal meshes composed of a plurality of metal lines 307. Each of the rhombic metal meshes is provided with one of the subpixels disposed therein. A shape of each of the subpixels is any one of rhombus, rectangle, and square. The metal meshes avoid the subpixels, and orthographic projections of the metal lines 307 that make up the metal meshes on the touch display device 40 is located between orthographic projections of two adjacent subpixels on the touch display device 40. Parts where the orthographic projections of the metal lines 307 on the touch display device and the orthographic projections of the redundant cathodes 2024 on the touch display device overlap are labeled as C (shown in dashed lines), and each of the overlapping parts C is located between two adjacent subpixels. Because an overlapping area between the metal lines 307 that make up the metal meshes and the common cathode 2023 is less than an area of an entire surface of the common cathode in prior art, thereby reducing parasitic capacitance between the touch electrodes and the common cathode 2023.

Figure 7:
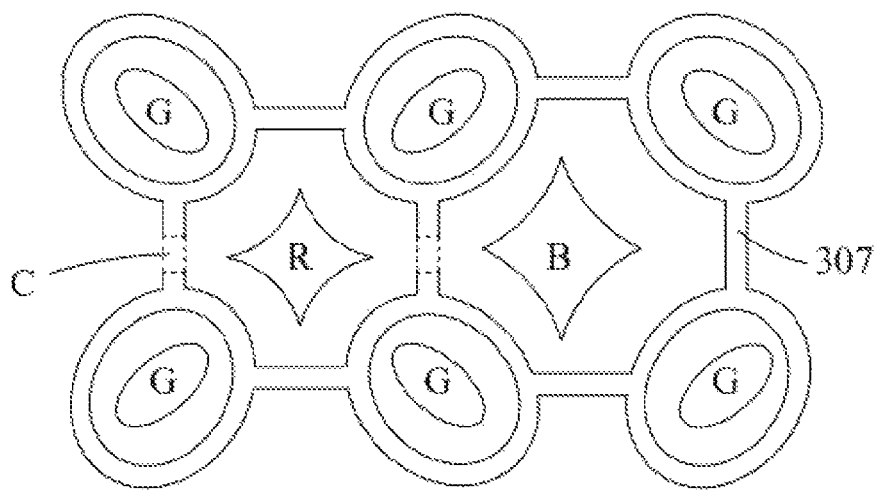
FIG. 7 is a second schematic view showing that touch electrodes surround subpixels and orthographic projections of the touch electrodes on the touch display device partially overlap orthographic projections of redundant cathodes on the touch display device.

As shown in FIG. 7, it is a second schematic view showing that the touch electrodes surround the subpixels and the orthographic projections of the touch electrodes on the touch display device partially overlap the orthographic projections of the redundant cathodes on the touch display device. The metal meshes include oval metal meshes and octagonal metal meshes, and each of the metal meshes is provided with one of the subpixels disposed therein. A shape of the subpixel is oval or quadrilateral. The quadrilateral has four depressive edges. Wherein the octagonal metal mesh is composed of part portions of four oval metal meshes and four metal connection sections. The green subpixels are oval subpixels, and the blue subpixels and red subpixels are quadrilateral subpixels. The metal meshes and the metal connection sections are all composed of metal lines 307. Parts where the orthographic projections of the metal lines 307 on the touch display device and the orthographic projections of the redundant cathodes 2024 on the touch display device overlap are labeled as C (parts enclosed by dashed lines).

In the embodiment, the OLED display panel 20 further includes partition portions 50 disposed on portions of the pixel definition layer 2019, and each of the portions is positioned between two adjacent subpixels. The partition portions 50 are configured to separate the common cathode 2023 from the plurality of redundant cathodes 2024. During an evaporation process of the cathode, because the partition portions 50 have a partition function, a film for evaporation can be naturally disconnected to form the cathode 2023 and the plurality of redundant cathodes 2024.

Figure 5:
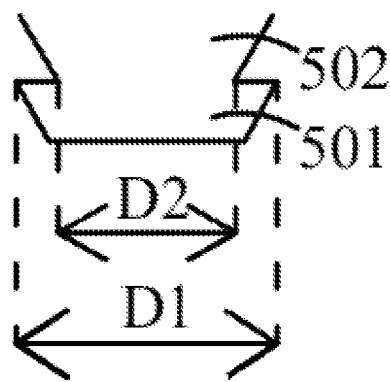
FIG. 5 is a schematic view of a partition portion of the touch display device in FIG. 2.

As shown in FIG. 5, it is a schematic view of the partition portion of the touch display device in FIG. 2. The partition portions 50 are grooves defined in the insulating layer. At least a part portion of the groove adjacent to a bottom of the groove has a first width D1, at least a part portion of the groove away from the bottom of the groove has a second width D2, and the first width D1 is greater than the second width D2. The redundant cathodes 2024 are disposed in the grooves. A cross section of each of the partition portions 50 is circular or square.

Specifically, the grooves are defined in the pixel definition layer 2019. In other embodiments, the partition portions 50 may also be inverted trapezoid humps disposed on the pixel definition layer 2019. The redundant cathodes 2024 in the grooves are in a floating state and are not connected to any external metal circuits or electrodes, thereby effectively preventing the parasitic capacitance from being generated between the touch electrodes composed of the metal meshes and the cathodes below them, which is beneficial to achieve a high touch report rate and improve touch sensitivity.

Specifically, the groove includes a first groove 501 and a second groove 502 communicated with the first groove 501. The first groove 501 has the first width D1, the second groove 502 has the second width D2, and the redundant cathode is disposed in the first groove 501. A longitudinal section of the first groove 501 is an inverted trapezoid, and a longitudinal section of the second groove 502 is also an inverted trapezoid. In other embodiments, a longitudinal section of the groove may also be an inverted trapezoid. A depth of the groove is less than or equal to a thickness of the pixel definition layer 2019.

In the embodiment, a dimension of each of the partition portions along a width direction of the metal lines 307 is greater than or equal to a width of one of the metal lines 307, thereby making a dimension of each of the redundant cathodes 2024 is greater than a width of one of the metal lines 307 in the width direction of the metal lines 307, and thereby maximizing an overlapping area of the redundant cathodes 2024 and the metal lines 307 in the width direction of the metal lines 307, so as to further reduce the parasitic capacitance of the touch electrodes. A dimension of the groove in the width direction of the metal lines 307 ranges from 4 um to 6 um, for example, 5 um, whereas, the width of one of the metal lines 307 is 3 um.

Figure 8:
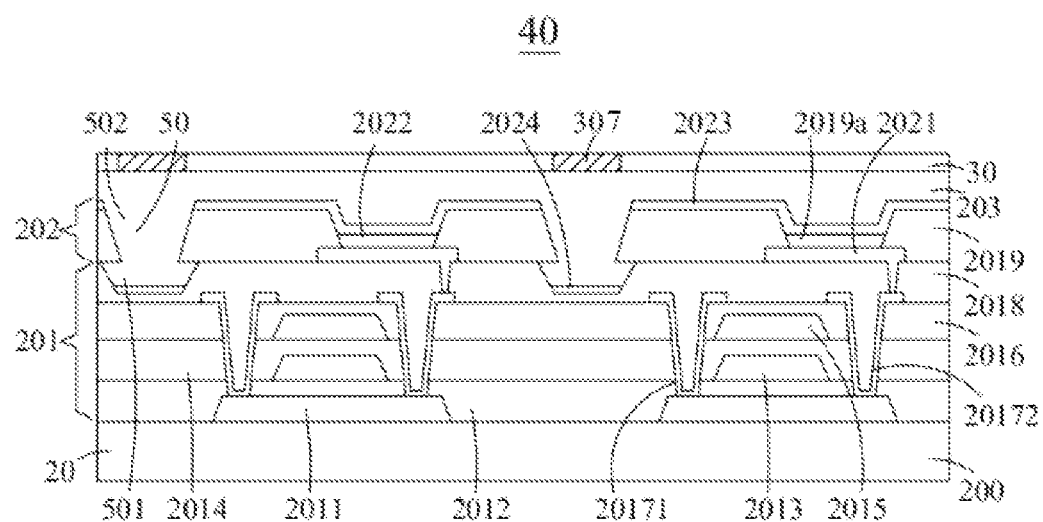
FIG. 8 is a schematic view of a touch display device in a second embodiment of the present disclosure.

Referring to FIG. 8, it is a schematic view of a touch display device in a second embodiment of the present disclosure. The touch display device shown in FIG. 8 is basically same as the touch display device shown in FIG. 2, except that: the second groove 502 is defined in the pixel definition layer 2019 and penetrates through the pixel definition layer 2019 in a thickness direction of the pixel definition layer 2019, and the first groove 501 is disposed on the planarization layer 2018, so as to ensure that the redundant cathodes 2024 and the cathode 2023 are separated during the evaporation process. A depth of the first groove 501 is less than or equal to a thickness of the planarization layer 2018.

The description of the above embodiments is only used to help understand the technical solution of the present disclosure and its core ideas; it will be understood by those of ordinary skill in the art that the technical solutions described in the foregoing embodiments may be modified or equivalently substituted for some or all of the technical features, and the modifications or substitutions do not depart from the scope of the technical solutions of the embodiments of the present disclosure.

What is claimed is:

1. A touch display device, wherein the touch display device comprises:
   an organic light emitting diode (OLED) display panel, the OLED display panel comprising a common cathode and a plurality of redundant cathodes, and the common cathode and the plurality of redundant cathodes located in a same conductive layer and electrically insulated, wherein the plurality of redundant cathodes are floating; and
   a touch layer, the touch layer disposed on a side of the OLED display panel, and the touch layer comprising a plurality of touch electrodes; and
   wherein orthographic projections of the plurality of touch electrodes on the touch display device partially overlap orthographic projections of the plurality of redundant cathodes on the touch display device; and
   the OLED display panel further comprises an encapsulation layer, and the encapsulation layer is located between the common cathode and the touch layer,
   wherein the OLED display panel comprises a plurality of subpixels and an insulating layer, the insulating layer comprises a plurality of openings, the plurality of subpixels are disposed in the plurality of openings, the plurality of subpixels share the common cathode, each of the redundant cathodes is positioned between adjacent two of the subpixels, the OLED display panel further comprises partition portions disposed on portions of the insulating layer, each of the portions of the insulating layer is positioned between adjacent two of the subpixels, and the partition portions are configured to separate the common cathode from the plurality of redundant cathodes, and
   wherein the partition portions are grooves defined in the insulating layer, at least a part portion of each of the grooves adjacent to a bottom of the grooves has a first width, at least a part portion of each of the grooves away from the bottom of the grooves has a second width, the first width is greater than the second width, and the redundant cathodes are disposed in the grooves.

2. The touch display device in claim 1, wherein the touch electrodes comprise a plurality of metal meshes, each of the metal meshes surrounds one of the subpixels, an orthographic projection of each of the metal meshes on the touch display device partially overlaps the orthographic projections of the plurality of redundant cathodes on the touch display device.

3. The touch display device in claim 2, wherein the orthographic projections of the plurality of redundant cathodes on the touch display device are evenly arranged along orthographic projections of the plurality of metal meshes on the touch display device.

4. The touch display device in claim 2, wherein the metal meshes comprise metal lines, a dimension of each of the partition portions along a width direction of the metal lines is greater than or equal to a width of one of the metal lines.

5. The touch display device in claim 1, wherein each of the grooves comprises a first groove and a second groove communicated with the first groove, the first groove has the first width, the second groove has the second width, and each of the redundant cathodes is disposed in the first groove.

6. The touch display device in claim 1, wherein the insulating layer further comprises a pixel definition layer, the grooves are defined in the pixel definition layer.

7. A touch display device, wherein the touch display device comprises:
   an organic light emitting diode (OLED) display panel, the OLED display panel comprising a common cathode and a plurality of redundant cathodes, and the common cathode and the plurality of redundant cathodes located in a same conductive layer and electrically insulated, wherein the plurality of redundant cathodes are floating; and
   a touch layer, the touch layer disposed on a side of the OLED display panel, and the touch layer comprising a plurality of touch electrodes; and
   wherein orthographic projections of the plurality of touch electrodes on the touch display device partially overlap orthographic projections of the plurality of redundant cathodes on the touch display device,
   wherein the OLED display panel comprises a plurality of subpixels and an insulating layer, the insulating layer comprises a plurality of openings, the plurality of subpixels are disposed in the plurality of openings, the plurality of subpixels share the common cathode, each of the redundant cathodes is positioned between adjacent two of the subpixels, the OLED display panel further comprises partition portions disposed on portions of the insulating layer, each of the portions of the insulating layer is positioned between adjacent two of the subpixels, and the partition portions are configured to separate the common cathode from the plurality of redundant cathodes, and wherein the partition portions are grooves defined in the insulating layer, at least a part portion of each of the grooves adjacent to a bottom of the grooves has a first width, at least a part portion of each of the grooves away from the bottom of the grooves has a second width, the first width is greater than the second width, and the redundant cathodes are disposed in the grooves.

8. The touch display device in claim 7, wherein the touch electrodes comprise a plurality of metal meshes, each of the metal meshes surrounds one of the subpixels, an orthographic projection of each of the metal meshes on the touch display device partially overlaps the orthographic projections of the plurality of redundant cathodes on the touch display device.

9. The touch display device in claim 8, wherein the orthographic projections of the plurality of redundant cathodes on the touch display device are evenly arranged along orthographic projections of the plurality of metal meshes on the touch display device.

10. The touch display device in claim 8, wherein the metal meshes comprise metal lines, a dimension of each of the partition portions along a width direction of the metal lines is greater than or equal to a width of one of the metal lines.

11. The touch display device in claim 7, wherein each of the grooves comprises a first groove and a second groove communicated with the first groove, the first groove has the first width, the second groove has the second width, and each of the redundant cathodes is disposed in the first groove.

12. The touch display device in claim 7, wherein the insulating layer further comprises a pixel definition layer, the grooves are defined in the pixel definition layer.

13. The touch display device in claim 11, wherein the insulating layer further comprises a pixel definition layer and a planarization layer, the second groove is defined in the pixel definition layer and penetrates through the pixel definition layer along a thickness direction of the pixel definition layer, and the first groove is defined in the planarization layer.

14. The touch display device in claim 11, wherein a longitudinal section of the first groove is an inverted trapezoid, and a longitudinal section of the second groove is an inverted trapezoid.

15. The touch display device in claim 7, wherein a percentage ratio of an area of the common cathode to a sum of the area of the common cathode and areas of the plurality of redundant cathodes is greater than or equal to 75% and is less than 100%.

16. The touch display device in claim 7, wherein the touch electrodes comprise driving electrodes and sensing electrodes, and the driving electrodes are electrically insulated from the sensing electrodes.

* * * * *